(12) United States Patent
Green et al.

(10) Patent No.: US 8,585,918 B2
(45) Date of Patent: Nov. 19, 2013

(54) METHOD OF ETCHING A SILICON-BASED MATERIAL

(75) Inventors: Mino Green, London (GB); Feng-Ming Liu, Abingdon (GB)

(73) Assignee: Nexeon Ltd., Oxford (GB)

( * ) Notice: Subject to any disclaimer, the term of this patent is extended or adjusted under 35 U.S.C. 154(b) by 770 days.

(21) Appl. No.: 12/161,657

(22) PCT Filed: Jan. 23, 2007

(86) PCT No.: PCT/GB2007/000204
§ 371 (c)(1),
(2), (4) Date: Mar. 12, 2010

(87) PCT Pub. No.: WO2007/083152
PCT Pub. Date: Jul. 26, 2007

(65) Prior Publication Data
US 2010/0233539 A1    Sep. 16, 2010

(30) Foreign Application Priority Data

Jan. 23, 2006 (GB) .................................. 0601318.9

(51) Int. Cl.
*H01L 21/02* (2006.01)
(52) U.S. Cl.
USPC ............... 216/99; 216/11; 216/40; 429/218.1
(58) Field of Classification Search
USPC .............................. 216/11, 40, 99; 429/218.1
See application file for complete search history.

(56) References Cited

U.S. PATENT DOCUMENTS

| | | | |
|---|---|---|---|
| 3,351,445 A | 11/1967 | Fielder et al. |
| 4,002,541 A | 1/1977 | Streander |
| 4,436,796 A | 3/1984 | Huggins et al. |
| 4,950,566 A | 8/1990 | Huggins et al. |
| 5,260,148 A | 11/1993 | Idota |
| 5,262,021 A | 11/1993 | Lehmann et al. |
| 5,660,948 A | 8/1997 | Barker |
| 5,907,899 A | 6/1999 | Dahn et al. |
| 5,980,722 A | 11/1999 | Kuroda et al. |
| 6,022,640 A | 2/2000 | Takada et al. |
| 6,042,969 A | 3/2000 | Yamada et al. |
| 6,063,995 A | 5/2000 | Bohland et al. |
| 6,235,427 B1 | 5/2001 | Idota et al. |
| 6,296,969 B1 | 10/2001 | Yano et al. |
| 6,334,939 B1 | 1/2002 | Zhou et al. |
| 6,337,156 B1 | 1/2002 | Narang et al. |
| 6,353,317 B1 | 3/2002 | Green et al. |
| 6,399,177 B1 | 6/2002 | Fonash et al. |
| 6,399,246 B1 | 6/2002 | Vandayburg et al. |
| 6,589,696 B2 | 7/2003 | Matsubara et al. |
| 6,605,386 B1 | 8/2003 | Kasamatsu et al. |
| 6,620,547 B1 | 9/2003 | Sung et al. |
| 6,887,511 B1 | 5/2005 | Shima et al. |
| 6,916,679 B2 | 7/2005 | Snyder et al. |
| 7,033,936 B1 | 4/2006 | Green |
| 7,070,632 B1 | 7/2006 | Visco et al. |
| 7,094,499 B1 | 8/2006 | Hung |
| 7,147,894 B2 | 12/2006 | Zhou et al. |
| 7,192,673 B1 | 3/2007 | Ikeda et al. |
| 7,311,999 B2 | 12/2007 | Kawase et al. |
| 7,318,982 B2 | 1/2008 | Gozdz et al. |
| 7,348,102 B2 | 3/2008 | Li et al. |
| 7,358,011 B2 | 4/2008 | Fukuoka et al. |
| 7,378,041 B2 | 5/2008 | Asao et al. |
| 7,425,285 B2 | 9/2008 | Asao et al. |
| 7,476,469 B2 | 1/2009 | Ota et al. |
| 7,569,202 B2 | 8/2009 | Farrell et al. |
| 7,659,034 B2 | 2/2010 | Minami et al. |
| 7,674,552 B2 | 3/2010 | Nakai et al. |
| 7,862,933 B2 | 1/2011 | Okumura et al. |
| 8,034,485 B2 | 10/2011 | Dehn et al. |
| 2001/0023986 A1 | 9/2001 | Mancevski |
| 2003/0135989 A1 | 7/2003 | Huggins et al. |
| 2004/0072067 A1 | 4/2004 | Minami et al. |
| 2004/0126659 A1 | 7/2004 | Graetz et al. |
| 2004/0151987 A1 | 8/2004 | Kawase et al. |
| 2004/0185346 A1 | 9/2004 | Takeuchi et al. |
| 2004/0197660 A1 | 10/2004 | Sheem et al. |
| 2004/0214085 A1 | 10/2004 | Sheem et al. |
| 2004/0224231 A1 | 11/2004 | Fujimoto et al. |
| 2004/0241548 A1 | 12/2004 | Nakamoto et al. |
| 2005/0042515 A1 | 2/2005 | Hwang et al. |
| 2005/0079414 A1 | 4/2005 | Yamamoto et al. |
| 2005/0079420 A1 | 4/2005 | Cho et al. |

(Continued)

FOREIGN PATENT DOCUMENTS

| | | |
|---|---|---|
| CN | 101442124 A | 5/2009 |
| DE | 103 47 570 A1 | 5/2005 |

(Continued)

OTHER PUBLICATIONS

Peng et al., "Uniform, axial-orientation of one dimensional single-crystal silicon nanostructure arrays", Angew. Chemic. Int. Ed., vol. 44, 2005, pp. 2737-2742.
Peng K et al., "Dendrite-assisted growth of silicon nanowires in electroless metal deposition", Advanced Functional Materials, Wiley Vch, Wienheim, DE, vol. 13, No. 2, Feb. 2003, pp. 127-132.
Qiu T et al., "Self-assembled growth and optical emission of silver-capped silicon nanowires", Applied Physics Letters, AIP, American Institute of Physics, Melville, NY, US, vol. 84, No. 19, May 10, 2004, pp. 3867-3869.
Peng Et Zhu, "Simultaneous gold deposition and formation of silicon nanowire arrays". Journal of Electroanalytical Chemistry, vol. 558, 2003, pp. 35-39.
Ivanovskaya et al., "The Effect of Treatment of Cation-Selective Glass Electrodes With AgNO3 Solution on Electrode Properties", Sensors and Actuators B 24-25 (1995) 304-308.

(Continued)

Primary Examiner — Stuart Hendrickson
(74) Attorney, Agent, or Firm — McDonnell Boehnen Hulbert & Berghoff LLP

(57) ABSTRACT

A method is described of selectively etching a silicon substrate in small local areas in order to form columns or pillars in the etched surface. The silicon substrate is held in an etching solution of hydrogen fluoride, a silver salt and an alcohol. The inclusion of the alcohol provides a greater packing density of the silicon columns.

35 Claims, No Drawings

(56) References Cited

U.S. PATENT DOCUMENTS

| | | |
|---|---|---|
| 2005/0118503 A1 | 6/2005 | Honda et al. |
| 2005/0191550 A1 | 9/2005 | Satoh et al. |
| 2005/0193800 A1 | 9/2005 | DeBoer et al. |
| 2005/0214644 A1 | 9/2005 | Aramata et al. |
| 2006/0003226 A1 | 1/2006 | Sawa et al. |
| 2006/0004226 A1 | 1/2006 | Machhammer et al. |
| 2006/0019115 A1 | 1/2006 | Wang et al. |
| 2006/0019168 A1 | 1/2006 | Li et al. |
| 2006/0024582 A1 | 2/2006 | Li et al. |
| 2006/0051670 A1 | 3/2006 | Aramata et al. |
| 2006/0057463 A1 | 3/2006 | Gao et al. |
| 2006/0088767 A1 | 4/2006 | Li et al. |
| 2006/0097691 A1 | 5/2006 | Green |
| 2006/0134516 A1 | 6/2006 | Im et al. |
| 2006/0134518 A1 | 6/2006 | Kogetsu et al. |
| 2006/0147800 A1 | 7/2006 | Sato et al. |
| 2006/0154071 A1 | 7/2006 | Homma et al. |
| 2006/0166093 A1 | 7/2006 | Zaghib et al. |
| 2006/0175704 A1 | 8/2006 | Shimizu et al. |
| 2006/0257307 A1 | 11/2006 | Yang |
| 2006/0263687 A1 | 11/2006 | Leitner et al. |
| 2006/0275663 A1 | 12/2006 | Matsuno et al. |
| 2006/0275668 A1 | 12/2006 | Peres et al. |
| 2006/0286448 A1 | 12/2006 | Snyder et al. |
| 2007/0026313 A1 | 2/2007 | Sano |
| 2007/0031733 A1 | 2/2007 | Kogetsu et al. |
| 2007/0037063 A1 | 2/2007 | Choi et al. |
| 2007/0048609 A1 | 3/2007 | Yeda et al. |
| 2007/0059598 A1 | 3/2007 | Yang |
| 2007/0065720 A1 | 3/2007 | Hasewaga et al. |
| 2007/0072074 A1 | 3/2007 | Yamamoto et al. |
| 2007/0087268 A1 | 4/2007 | Kim et al. |
| 2007/0099084 A1 | 5/2007 | Huang et al. |
| 2007/0099085 A1 | 5/2007 | Choi et al. |
| 2007/0105017 A1 | 5/2007 | Kawase et al. |
| 2007/0117018 A1 | 5/2007 | Huggins |
| 2007/0122702 A1 | 5/2007 | Sung et al. |
| 2007/0148544 A1 | 6/2007 | Le |
| 2007/0172732 A1 | 7/2007 | Jung et al. |
| 2007/0184345 A1 | 8/2007 | Neudecker et al. |
| 2007/0190413 A1 | 8/2007 | Lee et al. |
| 2007/0202395 A1 | 8/2007 | Snyder et al. |
| 2007/0202402 A1 | 8/2007 | Asahina et al. |
| 2007/0207080 A1 | 9/2007 | Yang |
| 2007/0207385 A1 | 9/2007 | Liu et al. |
| 2007/0209584 A1 | 9/2007 | Kalynushkin et al. |
| 2007/0212538 A1 | 9/2007 | Niu |
| 2007/0218366 A1 | 9/2007 | Kalynushkin et al. |
| 2007/0224508 A1 | 9/2007 | Aramata et al. |
| 2007/0224513 A1 | 9/2007 | Kalynushkin et al. |
| 2007/0238021 A1 | 10/2007 | Liu et al. |
| 2007/0243469 A1 | 10/2007 | Kim et al. |
| 2007/0264564 A1 | 11/2007 | Johnson et al. |
| 2007/0264574 A1 | 11/2007 | Kim et al. |
| 2007/0269718 A1 | 11/2007 | Krause et al. |
| 2007/0277370 A1 | 12/2007 | Kalynushkin et al. |
| 2008/0003496 A1 | 1/2008 | Neudecker et al. |
| 2008/0003503 A1 | 1/2008 | Kawakami et al. |
| 2008/0020281 A1 | 1/2008 | Kogetsu et al. |
| 2008/0038638 A1 | 2/2008 | Zhang et al. |
| 2008/0090149 A1 | 4/2008 | Sano et al. |
| 2008/0096110 A1 | 4/2008 | Bito et al. |
| 2008/0107967 A1 | 5/2008 | Liu et al. |
| 2008/0113271 A1 | 5/2008 | Ueda et al. |
| 2008/0118834 A1 | 5/2008 | Yew et al. |
| 2008/0124631 A1 | 5/2008 | Fukui et al. |
| 2008/0131782 A1 | 6/2008 | Hagiwara et al. |
| 2008/0138710 A1 | 6/2008 | Liaw et al. |
| 2008/0138716 A1 | 6/2008 | Iwama et al. |
| 2008/0145752 A1 | 6/2008 | Hirose et al. |
| 2008/0145759 A1 | 6/2008 | Sung et al. |
| 2008/0160415 A1 | 7/2008 | Wakita et al. |
| 2008/0176139 A1 | 7/2008 | White et al. |
| 2008/0206631 A1 | 8/2008 | Christensen et al. |
| 2008/0206641 A1 | 8/2008 | Christensen et al. |
| 2008/0233479 A1 | 9/2008 | Sung et al. |
| 2008/0233480 A1 | 9/2008 | Sung et al. |
| 2008/0241647 A1 | 10/2008 | Fukui et al. |
| 2008/0241703 A1 | 10/2008 | Yamamoto et al. |
| 2008/0248250 A1 | 10/2008 | Flemming et al. |
| 2008/0261112 A1 | 10/2008 | Nagata et al. |
| 2008/0305391 A1 | 12/2008 | Hirose et al. |
| 2009/0053589 A1 | 2/2009 | Obrovac et al. |
| 2009/0087731 A1 | 4/2009 | Fukui et al. |
| 2009/0186267 A1 | 7/2009 | Tiegs |
| 2009/0239151 A1 | 9/2009 | Nakanishi et al. |
| 2009/0305129 A1 | 12/2009 | Fukui et al. |
| 2010/0085685 A1 | 4/2010 | Pinwill |
| 2010/0092868 A1 | 4/2010 | Kim et al. |
| 2010/0124707 A1 | 5/2010 | Hirose et al. |
| 2010/0136437 A1 | 6/2010 | Nishida et al. |
| 2010/0285358 A1 | 11/2010 | Cui et al. |
| 2010/0297502 A1 | 11/2010 | Zhu et al. |
| 2010/0330419 A1 | 12/2010 | Cui et al. |

FOREIGN PATENT DOCUMENTS

| | | |
|---|---|---|
| EP | 0 281 115 | 9/1988 |
| EP | 0 820 110 A2 | 1/1998 |
| EP | 1 011 160 A1 | 6/2000 |
| EP | 0 936 687 B1 | 12/2001 |
| EP | 1 231 653 A1 | 8/2002 |
| EP | 1 231 654 A1 | 8/2002 |
| EP | 1 258 937 A1 | 11/2002 |
| EP | 1 083 614 B1 | 5/2003 |
| EP | 1 313 158 A2 | 5/2003 |
| EP | 1 335 438 A1 | 8/2003 |
| EP | 1 289 045 B1 | 3/2006 |
| EP | 1 657 769 A1 | 5/2006 |
| EP | 1 850 409 A1 | 10/2007 |
| EP | 1 771 899 B1 | 2/2008 |
| EP | 1 657 768 B1 | 5/2008 |
| EP | 2 058 882 | 5/2009 |
| FR | 2 885 913 B1 | 8/2007 |
| GB | 980513 | 1/1965 |
| GB | 1 014 706 | 12/1965 |
| GB | 2 395 059 A | 5/2004 |
| GB | 2 464 157 B | 1/2010 |
| GB | 2 464 158 | 4/2010 |
| JP | 02-209492 A | 8/1990 |
| JP | 6-283156 | 10/1994 |
| JP | 10-046366 | 2/1998 |
| JP | 10-83817 | 3/1998 |
| JP | 10-199524 | 7/1998 |
| JP | 2000-3727 | 1/2000 |
| JP | 2000-173594 | 6/2000 |
| JP | 2000-348730 A | 12/2000 |
| JP | 2001-291514 | 10/2001 |
| JP | 2002-279974 A | 9/2002 |
| JP | 2002-313319 A | 10/2002 |
| JP | 2003-017040 | 1/2003 |
| JP | 2003-168426 | 6/2003 |
| JP | 04-607488 | 2/2004 |
| JP | 2004-71305 | 3/2004 |
| JP | 2004-095264 | 3/2004 |
| JP | 2004-214054 | 7/2004 |
| JP | 2004-281317 | 10/2004 |
| JP | 2004-296386 A | 10/2004 |
| JP | 2004-533699 A | 11/2004 |
| JP | 2006-505901 A | 2/2006 |
| JP | 2006-276214 A | 10/2006 |
| JP | 2006-290938 A | 10/2006 |
| JP | 2006-335410 A | 12/2006 |
| JP | 2007-165079 A | 6/2007 |
| JP | 2008-034266 | 2/2008 |
| JP | 2008-186732 | 8/2008 |
| JP | 2008-234988 | 10/2008 |
| JP | 2009-252348 A | 10/2009 |
| KR | 2007-023141 | 2/2007 |
| KR | 2007-0110569 A | 11/2007 |
| KR | 2008-038806 A | 5/2008 |
| NL | 1015956 | 8/2000 |
| SU | 471402 | 5/1975 |
| SU | 544019 | 1/1977 |

(56) References Cited

FOREIGN PATENT DOCUMENTS

| WO | WO 99/33129 | 7/1999 |
|---|---|---|
| WO | WO 01/13414 A1 | 2/2001 |
| WO | WO 01/35473 A1 | 5/2001 |
| WO | WO 01/96847 | 12/2001 |
| WO | WO 01/96847 A1 | 12/2001 |
| WO | WO 02/25356 A2 | 3/2002 |
| WO | WO 02/47185 A2 | 6/2002 |
| WO | WO 03/063271 A1 | 7/2003 |
| WO | WO 03/075372 A2 | 9/2003 |
| WO | WO 2004/042851 | 5/2004 |
| WO | WO 2004/042851 A2 | 5/2004 |
| WO | WO 2004/052489 A2 | 6/2004 |
| WO | WO 2004/083490 A2 | 9/2004 |
| WO | WO 2005/011030 A1 | 2/2005 |
| WO | WO 2005/119753 A2 | 12/2005 |
| WO | WO 2006/067891 A1 | 6/2006 |
| WO | WO 2006/073427 A2 | 7/2006 |
| WO | WO 2006/120332 A2 | 11/2006 |
| WO | WO 2007/044315 A1 | 4/2007 |
| WO | WO 2007/083152 | 7/2007 |
| WO | WO 2007/083155 | 7/2007 |
| WO | WO 2007/083155 A1 | 7/2007 |
| WO | WO 2007/114168 A1 | 10/2007 |
| WO | WO 2008/029888 A1 | 3/2008 |
| WO | WO 2008/044683 A1 | 4/2008 |
| WO | WO 2008/072460 A1 | 6/2008 |
| WO | WO 2008/097723 A1 | 8/2008 |
| WO | WO 2008/139157 A1 | 11/2008 |
| WO | WO 2009/010757 | 1/2009 |
| WO | WO 2009/010758 | 1/2009 |
| WO | WO 2009/010759 | 1/2009 |
| WO | WO 2009/026466 | 2/2009 |
| WO | WO 2009/128800 | 10/2009 |
| WO | WO 2010/040985 | 4/2010 |
| WO | WO 2010/040986 | 4/2010 |
| WO | WO 2010/060348 A1 | 6/2010 |
| WO | WO 2010/130975 A1 | 11/2010 |
| WO | WO 2010/130976 A1 | 11/2010 |

OTHER PUBLICATIONS

Peng et al., "Fabrication of Large-Area Silicon Nanowire p-n Junction Diode Arrays", Adv. Mater. (2004), vol. 16, No. 1, 73-76.

Peng et al., "Silicon Nanowires for Rechargeable Lithium-ion Battery Anodes", Applied Physics Letters (2008) vol. 93, No. 3, pp. 33105-1 to 33105-3.

Badel at al., "Formation of Ordered Pore Arrays at the Nanoscale by Electrochemical Etching of N-Type Silicon", Superlattices and Microstructures, 36 (2004) 245-253.

Beaulieu et al., "Colossal Reversible Volume Changes in Lithium Alloys", Electrochemical and Solid-State Letters, 4 (9) (2001) A137-A140.

Beaulieu at al., "Reaction of Li with Grain-Boundary Atoms in Nanostructured Compounds", Journal of The Electrochemical Society, 147 (9) (2000) 3206-3212.

Besenhard et al., "Will Advanced Lithium-Alloy Anodes Have a Chance in Lithium-Ion Batteries?", Journal of Power Sources, 68 (1997) 87-90.

Boukamp et al., "All-Solid Lithium Electrodes with Mixed-Conductor Matrix", J. Electrochem. Soc.: Electrochemical Science and Technology. vol. 128, No. 4, (1981) 725-729.

Bourderau, et al., "Amorphous Silicon as a Possible Anode Material for Li-Ion Batteries", Journal of Power Sources, 81-82 (1999) 233-236.

Colinge, Jean-Pierre, "Silicon-on-Insulator Technology: Materials to VLSI", Chapter 2, SOI Materials, (1991), Cover page and p. 38.

Deal et al., "General Relationship for the Thermal Oxidation of Silicon", Journal of Applied Physics, vol. 36, No. 12, (Dec. 1965) 3770-3778.

Feng et al., "Lithography-Free Silicon Micro-Pillars as Catalyst Supports for Microfabricated Fuel Cell Applications", Electrochemistry Communications, 8 (2006) 1235-1238.

Green et al., "Quantum Pillar Structures on n+ Gallium Arsenide Fabricated Using "Natural" Lithography", Appl. Phys. Lett., 62 (3) (1993) 264-266.

Green et al., "Structured Silicon Anodes for Lithium Battery Applications", Electrochemical and Solid-State Letters, 6 (5) (2003) A75-A79.

Green et al., "Mesoscopic Hemisphere Arrays for use as Resist in Solid State Structure Fabrication", J. Vac. Sci. Technol. B 17(5) (1999) 2074-2083.

Yan et al., "Growth of Amorphous Silicon Nanowires via a Solid-Liquid-Solid Mechanism", Chemical Physics Letters, 323 (2000) 224-228.

Shin et al., "Porous Silicon Negative Electrodes for Rechargeable Lithium Batteries", Journal of Power Sources, 139 (2005) 314-320.

Li et al., "A High Capacity Nano-Si Composite Anode Material for Lithium Rechargeable Batteries", Electrochemical and Solid-State Letters, 2 (11) (1999) 547-549.

Li et al., "The Crystal Structural Evolution of Nano-Si Anode Caused by Lithium Insertion and Extraction at Room Temperature", Solid State Ionics, 135 (2000) 181-191.

Huggins, Robert A., "Lithium Alloy Anodes" in Handbook of Battery Materials, J.O. Besenhard Ed., Wiley-VCH, Weinheim, 361-381 (1999).

Chang et al., "Ultrafast Growth of Single-Crystalline Si Nanowires", Materials Letters, 60 (2006) 2125-2128.

Kim et al., "Improvement of Silicon Powder Negative Electrodes by Copper Electroless Deposition for Lithium Secondary Batteries", Journal of Power Sources, 147 (2005) 227-233.

Jianfeng et al., "Large-Scale Array of Highly Oriented Silicon-Rich Micro/Nanowires Induced by Gas Flow Steering", Solid State Communications, 133 (2005) 271-275.

Lu et al., "A Study of the Mechanisms of Erosion in Silicon Single Crystals Using Hertzian Fracture Tests", Wear, 186-187 (1995) 105-116.

Kleimann et al., "Formation of Wide and Deep Pores in Silicon by Electrochemical Etching", Materials Science and Engineering, B69-70 (2000) 29-33.

Kolasinski, Kurt W., "Silicon Nanostructures from Electroless Electrochemical Etching", Current Opinion in Solid State and Materials Science, 9 (2005) 73-83.

Pei et al., "Silicon Nanowires Grown from Silicon Monoxide Under Hydrothermal Conditions", Journal of Crystal Growth, 289 (2006) 423-427.

Chen et al., "Selective Etching of Silicon in Aqueous Ammonia Solution", Sensors and Actuators, A 49 (1995) 115-121.

Maranchi et al., "Interfacial Properties of the a-Si/Cu:Active-Inactive Thin-Film Anode Systems for Lithium-Ion Batteries", Journal of the Electrochemical Society: 153 (6) (2006) A1246-A1253.

Nakahata et al., "Fabrication of Lotus-Type Porous Silicon by Unidirectional Solidification in Hyrdogen", Materials Science and Engineering A 384 (2004) 373-376.

Niparko, J.K. (Editor), "Cochlear Implant Technology", Pub., Lippincott Williams and Wilkins, Philadelphia, (2000) 108-121.

Ohara at al., "A Thin Film Silicon Anode for Li-Ion Batteries Having a Very Large Specific Capacity and Long Cycle Life", Journal of Power Sources, 136 (2004) 303-306.

Peng et al., "Dendrite-Assisted Growth of Silicon Nanowires in Electroless Metal Deposition", Adv. Funct. Mater., 13, No. 2 (2003) 127-132.

Peng et al., "Synthesis of Large-Area Silicon Nanowire Arrays via Self-Assembling Nanoelectrochemistry", Adv. Mater., 14, No. 16 (2002) 1164-1167.

Winter, et al., "Insertion Electrode Materials for Rechargeable Lithium Batteries", Advanced Materials, 1998, 10, No. 10.

Kasavajjula et al., "Nano- and Bulk-Silicon-Based Insertion Anodes for Lithium-Ion Secondary Cells", Journal of Power Sources, 163 (2007) 1003-1039.

Peng, et al., "Fabrication of Single-Crystalline Silicon Nanowires by Scratching a Silicon Surface with Catalytic Metal Particles", Adv. Funct. Mater., 16 (2006), 387-394.

Barraclough et al., "Cold Compaction of Silicon Powders Without a Binding Agent", Materials Letters 61 (2007) 485-487.

(56) References Cited

OTHER PUBLICATIONS

Chan et al., "Surface Chemistry and Morphology of the Solid Electrolyte Interphase on Silicon Nanowire Lithium-Ion Battery Anodes", Journal of Power Sources, 189(2), 1132-1140, (2009).

Chen et al., Binder Effect on Cycling Performance of Silicon/Carbon Composite Anodes for Lithium Ion Batteries, 36 (2006) 1099-1104.

Chen et al., "Effect of Vinylene Carbonate (VC) as Electrolyte Additive on Electrochemical Performance of Si Film Anode for Lithium Ion Batteries", Journal of Power Sources, 174(2), 538-543.(2007).

Chevrier et al., "Methods for Successful Cycling of Alloy Negative Electrodes in Li-Ion Cells", $220^{th}$ ECS Meeting, Abstract #1237 (2011).

Choi at al., "Effect of Fluoroethylene Carbonate Additive on Interfacial Properties of Silicon Thin-Film Electrode", Journal of Power Sources, 161(2), 1254-1259 (2006).

El Ouatani at al., "The Effect of Vinylene Carbonate Additive on Surface Film Formation on Both Electrodes in Li-Ion Batteries", J. Electrochem. Soc., 156(2), A103-A113 (2009).

Han et al., "Neutralized Poly (Acrylic Acid) as Polymer Binder for High Capacity Silicon Negative Electrodes", $220^{th}$ ECS Meeting, Abstract #1250 (2011).

Heinze et al., "Viscosity Behaviour of Multivalent Metal Ion-Containing Carboxymethyl Cellulose Solutions", Die Angewandte Makromolekulare Chamie 220, 123-132, (Nr. 3848), (1994).

Hochgatterer et al., "Silicon/Graphite Composite Electrodes for High Capacity Anodes: Influence of Binder Chemistry on Cycling Stability", Electrochemical and Solid-State Letters, 11 (5) (2008) A76-A80.

Komba et al., "Functional Interface of Polymer Modified Graphite Anode", Journal of Power Sources, 189, (2009), 197-203.

Komba et al., "Polyacrylate as Functional Binder for Silicon and Grapite Composite Electrode in Lithium-Ion Batteries", Electrochemistry, 79(1), (2011), 6-9.

Komba et al., "Polyacrylate Modifier for Graphite Anode of Lithium-Ion Batteries", Electrochemical and Solid-State Letters, 12(5), (2009), A107-A110.

Komba et al., "Study on Polymer Binders for High-Capacity SiO Negative Electrode of Li-Ion Batteries", Journal of Physical Chemistry, 115, (2011), 13487-13495.

Lee et al., "Effect of Poly (Acrylic Acid) on Adhesion Strength and Electrochemical Performance of Natural Graphite Negative Electrode for Lithium-Ion Batteries", Journal of Power Sources, 161(1), (2006), 612-616.

Li at al., "Sodium Carboxymethyl Cellulose: A Potential Binder for Si Negative Electrodes for Li-Ion Batteries", Electrochemical and Solid-State Letters, 10(2) (2007), A17-A20.

Liu et al., "Enhanced Cycle Life of Si Anode for Li-Ion Batteries by Using Modified Elastomeric Binder", Electrochemical and Solid-State Letters, 8(2) (2005), A100-A103.

Obrovac at al., "Structural Changes in Silicon Anodes During Lithium Insertion/Extraction", Electrochemical and Solid-State Letters, 7(5), (2004), A96-A96.

Sugama, et al., "Nature of Interfacial Interaction Mechanisms Between Polyacrylic Acid Macromolecules and Oxide Metal Surfaces", Journal of Materials Science, 19 (1984) 4045-4056.

Ui et al., "Improvement of Electrochemical Characteristics of Natural Graphite Negative Electrode Coated With Polyacrylic Acid in Pure Propylene Carbonate Electrolyte", Journal of Power Sources, 173(1), (2007), 518-521.

Wen et al., "Chemical Diffusion in Intermediate Phases in the Lithium-Silicon System", Journal of Solid State Chemistry, 37 (1981) 271-278.

Weydanz et al., "A Room Temperature Study of the Binary Lithium-Silicon and the Ternary Lithium-Chromium-Silicon System for use in Rechargeable Lithium Batteries", Journal of Power Sources, 81-82 (1999) 237-242.

Yabuuchi et al., "Graphite-Silicon-Polyacrylate Negative Electrodes inIonic Liquid Electrolyte for Safer Rechargeable Li-Ion Batteries", Advanced Energy Materials, 1, (2011), 759-765.

Zhang et al., "A Review on Electrolyte Additives for Lithium-Ion Batteries", Journal of Power Sources, 162(2), 1379-1394, (2006).

Key to Metal Aluminum-Silicon Alloys, www.keytometals.com/Article80.

Peng et al., "Uniform, Axial-Orientation Alignment of One-Dimensional Single-Crystal Silicon Nanostructure Arrays", Angew. Chem. Ind. Ed., 44 (2005) 2737-2742.

Peng et al., "Simultaneous Gold Deposition and Formation of Silicon Nanowire Arrays", Journal of Electroanalytical Chemistry, 558 (2003) 35-39.

Canham, L. T., "Diffusion of Li IN Si", Properties of Silicon, EMIS Datareviews Series No. 4 (1987) 454-462.

Qiu et al., "Self-Assembled Growth and Optical Emission of Silver-Capped Silicon Nanowires", Applied Physics Letters, vol. 84, No. 19, (2004) 3867-3869.

Kim et al., "(110) Silicon Etching for High Aspect Ratio Comb Structures", 1997 6th International Conference on Emerging Technologies and Factory Automation Proceedings, (1997) 248-252.

Sharma et al., "Thermodynamic Properties of the Lithium-Silicon System", J. Electrochem. Soc.: Electrochemical Science and Technology, vol. 123 (1976) 1763-1768.

Qiu et al., "From Si Nanotubes to Nanowires: Synthesis, Characterization, and Self-Assembly", Journal of Crystal Growth, 277 (2005) 143-148.

Tokoro et al., "Anisotropic Etching Properties of Silicon in KOH and TMAH Solutions", Proceedings of the 1998 International Symposium on Micromechatronics and Human Science (1998) 65-70.

Tsuchiya et al., "Structural Fabrication Using Cesium Chloride Island Arrays as a Resist in a Fluorocarbon Reactive Ion Etching Plasma", Electrochemical and Solid-State Letters, 3 (1) (2000) 44-46.

Wagner et al., "Vapor-Liquid-Solid Mechanism of Single Crystal Growth", Applied Physics Letters, vol. 4, No. 5 (1964) 89-90.

Lang, Walter, "Silicon Microstructuring Technology", Materials Science and Engineering, R17 (1996) 1-55.

Liu et al., "Effect of Electrode Structure on Performance of Si Anode in Li-Ion Batteries: Si Particle Size and Conductive Additive", Journal of Power Source, 140 (2005) 139-144.

Yan et al., "$H_2$-Assisted Control Growth of Si Nanowires", Journal of Crystal Growth, 257 (2003) 69-74.

Liu et al., "A Novel Method of Fabricating Porous Silicon Material: Ultrasonically Enhanced Anodic Electrochemical Etching", Solid State Communications, 127 (2003) 583-588.

Zhang et al., "Bulk-Quantity Si Nanowires Synthesized by SiO Sublimation", Journal of Crystal Growth, 212 (2000) 115-118.

Wong et al., "Controlled Growth of Silicon Nanowires Synthesized Via Solid-Liquid-Solid Mechanism", Science and Technology of Advanced Materials, 6 (2005) 330-334.

Zhang et al., "Synthesis of Thin Si Whiskers (Nanowires) Using $SiCl_4$", Journal of Crystal Growth, 2006 (2001) 185-191.

Yoshio et al., "Electrochemical Behaviors of Silicon Based Anode Material", Journal of Power Sources, 153 (2006) 375-379.

Zhang et al., "Catalytic Growth of x -$FiSi_2$ and Silicon Nanowires", Journal of Crystal Growth, 280 (2005) 286-291.

METHOD OF ETCHING A SILICON-BASED MATERIAL

FIELD OF INVENTION

The invention relates to a method of etching a silicon-based material.

BACKGROUND ART

Selective etching of silicon-based materials to create silicon pillars is known to be of benefit, for example, in creating anodes for lithium-rechargeable batteries. One such approach is described in U.S. Pat. No. 7,033,936, which is incorporated herein by reference. According to this document, pillars are fabricated by creating a mask by depositing hemispherical islands of caesium chloride on a silicon substrate surface, covering the substrate surface, including the islands, with a film, and removing the hemispherical structures (including the film covering them) from the surface to form a mask with exposed areas where the hemispheres had been. The substrate is then etched in the exposed areas using reactive ion etching and the resist is removed, e.g. by physical sputtering, to leave an array of silicon pillars in the unetched regions, i.e. in the regions between the locations of the hemispheres.

An alternative, chemical approach is described in Peng K-Q, Yan, Y-J, Gao S-P, and Zhu J., Adv. Materials, 14 (2002), 1164-1167, Adv. Functional Materials, (2003), 13, No 2 February, 127-132 and Adv. Materials, 16 (2004), 73-76. Peng, et al. have shown a way to make nano pillars on silicon by a chemical method. According to this method, a silicon wafer, which may be n- or p-type and has the {111} face exposed to solution, is etched at 50° C. using the following solution: 5M HF and 20 mM $AgNO_3$. Pillars are formed at about 20 microns/hr and pillar heights up to 24 microns are reported. Apart from height, no other dimensional data is given, such as mean pillar diameter, packing density, or surface uniformity. The method is only carried on chips of about 1 $cm^2$. The mechanism postulated in these papers is that isolated nanoclusters of silver are electrolessly deposited on the silicon surface in an initial stage. In a second stage, the silver nanoclusters and the areas of silicon surrounding them act as local electrodes that cause the electrolytic oxidation of the silicon in the areas surrounding the silver nanoclusters to form $SiF_6$ cations, which diffuse away from the etching site to leave the silicon underlying the silver nanocluster in the form pillars. It is suggested that metals other than silver, e.g. Ni, Fe, Co, Cr and Mg, especially in the form of nitrate salts, could be used to form silicon pillars.

K. Peng et al., Angew. Chem. Int. Ed., 44 (2005), 2737-2742; and K. Peng et al., Adv. Funct. Mater., 16 (2006), 387-394, relate to an etching method that is similar to that described in the earlier papers by Peng et al but the nucleation/silver nanoparticle deposition step and the etching step are performed in different solutions. In a first (nucleation) step, a silicon chip is placed in a solution of 4.6M HF and 0.01M $AgNO_3$ for 1 minute. A second (etching) step is then performed in a different solution, namely 4.6M HF and 0.135M $Fe(NO_3)_3$ for 30 or 50 minutes. Both steps are carried out at 50° C. Pillars of about 6 and 4 microns in height, and about 20 and 20 to 40 nm in diameter, respectively, are reported. Pillars are grown in the {111} direction on the {111} plane. Neither the pillar packing density (surface uniformity), nor the size of silicon chip used are disclosed. The silicon wafer may be n- or p-type. In these papers, a different mechanism is proposed for the etching step as compared to the earlier papers, namely that silicon underlying the silver (Ag) nanoparticles are removed and the nanoparticles gradually sink into the bulk silicon, leaving columns of silicon in the areas that are not directly underlying the silver nanoparticles.

There is a need for higher pillars, increased density of pillars and improved uniformity of pillar distribution. In addition, it would be desirable to increase the speed of pillar formation (etching). Furthermore, because the approaches described in Peng are restricted to the {111} face, the applicability of these approaches is limited.

DISCLOSURE OF THE INVENTION

The invention is set out in the claims.

A method is now described according to which an improved chemical method is provided for creating silicon pillars on a silicon-based substrate.

Starting with chips (which may be about 1 to 15 $cm^2$) taken from a silicon wafer, in standard semiconductor material, one side of the chip is polished, while the other side is distressed (roughened). The plane of the wafer corresponds to the {100} or {110} crystal plane of silicon. The silicon may be doped, e.g. using any conventional doping agent, to make the silicon n-type or p-type as desired. The typical resistivity of the silicon chip is 1 ohm cm plus or minus two powers of ten. For example in the case of n-type silicon, the resistivity is typically and approximately one ohm cm and it will be noted that the doping level is not critical in the embodiments described herein.

Before being subjected to the method of the present invention, the surface may be rendered uniformly clean and hydrophilic using an RCA-1 etch (namely water:88 ammonia:concentrated hydrogen peroxide, in the volume ratio of 1:1:1). In the next preparation stage, the silicon chip can be protected on its back (rougher) side by a thin Au/Cr coating (e.g. 10Au/1Cr, ca 200 nm thick film).

The etching method comprises two stages. The first stage is nucleation in which discrete metal deposits are formed on the silicon surface and the second stage is the actual etching of the substrate. The carrying out of these two stages in accordance with the present invention results in a more uniform pillar array in terms of both density and height.

The first nucleation stage forms discrete metallic deposits on the surface of the silicon. The chemical composition of the aqueous solution used in the nucleation stage in one embodiment is:

1 to 40% v/v of an alcohol, e.g. ethanol; typical alcohol contents of the solution are 5 to 40%, e.g. 15 to 40%, optionally about 5 or 6% v/v, based on the total volume of the whole aqueous solution;

1.5 to 10 molar (M) hydrofluoric acid, e.g. 5 to 7.5M, for example about 6.8M (Examples of typical concentrations are 4.5-9M, e.g. 6.8 to 7.9M; it should be noted that 4.5M, 6.8M, 7.9M and 9M solutions of HF or a fluoride salt correspond, respectively, to the inclusion within the solutions of 20%, 30%, 35% and 40% by volume of concentrated (40%) HF);

5 to 100 mM, e.g. 10 to 65 mM of a metal salt that will electrolessly deposit in discrete areas on the silicon substrate in the presence of fluoride ions, the salt optionally being a silver salt, e.g. silver nitrate; the concentration of the salt may be 12.6 to 24 mM, e.g. 24 mM. (It should be noted that a 12.6 to 22.1 mM solution is the equivalent of a solution containing 40 to 70% of a 31.5 mM silver solution and a 24 mM solution is the equivalent of a solution containing 40% of a 0.06M (60 mM) silver solution).

The temperature at which the nucleation reaction is carried out at may be 0 to 30° C. and, for example room temperature (20° C.). The nucleation reaction will occur rapidly, e.g. within 10 seconds, but the substrate may be in contact with the substrate for up to about 15 minutes, e.g. about 10 minutes. The inclusion of an alcohol, e.g. ethanol and the act of carrying out the nucleation stage at a relatively low temperature, e.g. at room temperature, has the effect of slowing down the chemical processes. Hence a more even distribution of the metal deposits, e.g. silver, is achieved and more evenly spaced pillars are subsequently obtained.

The second stage is etching, during which the silicon pillars are formed. The solution used in the etching stage may be the same or different to that used in the nucleation stage. If the same solution is used, the second (etching) stage may follow on seamlessly from the first (nucleation) stage and the overall duration of the first and second stages is generally in the region of 5 to 50 minutes. If a different solution is used, the first nucleation stage may generally be 5 to 10 minutes. The solution used in the etching stage may be:

- hydrofluoric acid (HF); the concentration of fluoride ions may be 4 to 15 M e.g. 4.5 to 8M;
- a metal salt that can oxidise silicon in the presence of fluoride ions; the salt is optionally a silver salt or a ferric salt; and preferably silver or ferric nitrate salt. The concentration of the salt may be 10 to 40 mM e.g. 20 to 30 mM, for example about 25 mM.

Alcohol is not necessary in the etching stage.

The etching stage is optionally, depending upon doping density, carried out at a temperature higher than that of the nucleation stage; the temperature increase between the two stages may be at least 20° C., e.g. at least 35° C.; the etching stage may be performed at a temperature of 30 to 80° C., e.g. 45 to 75° C., such as 60° to 75° C.; within about 45 minutes, pillars of consistent height of about 70 to 75 microns in height and 0.2 microns in diameter can be achieved. The etching stage may be conducted for a shorter period of time but the columns will be shorter.

The resulting silicon-based substrate with its attached silicon pillars may be used as the anode for a lithium-ion rechargeable battery since the inventor believes that the silicon pillars can reversibly react with lithium ions without being broken up or destroyed, thus providing good capacity retention over a large number of charge/discharge cycles. Alternatively the pillars may be sheared from the part of the substrate that has not been etched to form silicon fibres. The substrate of the present invention finds particular application in the electrodes of lithium-ion cells.

The pillar surface density (fractional coverage) may be described by the following ratio F:

$$F=P/[R+P]$$

wherein P is the amount of silicon present as pillars, and R is the amount of silicon removed.

For a fixed pillar height, the larger the value of F, the greater the reversible lithium ion capacity per unit area and so the greater the electrical capacity of an electrode. Also the greater the value of F, the larger the amount of silicon material that may be harvested to create silicon fibre. The pillar packing density F is maximised by the nucleation stage and the applicants have achieved fractional coverages of up to 40%.

In the process described above, F is typically about 15 to 20%.

In one embodiment, the invention provides a method of etching a silicon substrate comprising contacting the silicon substrate with a solution of an etching fluoride acid or fluoride salt, a silver salt and an alcohol. The silver salt is water soluble, e.g. silver nitrate. The silver nitrate content of the solution may be in the range 40 to 70%, based on a 31.5 mM solution of silver nitrate, which is equivalent to a silver nitrate concentration in the final solution of 12.6 to 22.1 mM silver nitrate. The fluoride acid may comprise hydrogen fluoride whose content in the solution is between 30% and 40% by volume, based on concentrated (40% or 22.6 M) HF, which is equivalent to an HF concentration in the final solution of 6.8 to 9 M), e.g. in the range 35 to 40% (HF concentration in the final solution of 7.9 to 9 M), for example 40% (HF concentration in the final solution of 9 M). The alcohol may be ethanol, the content of which in the final solution may be in the range of 15 to 40%. The solution may also include water in the range of 10 to 30%, e.g. 20%.

The method may include the stage of allowing the substrate to stand in solution at a temperature in the range of 10 to 30°, e.g. 20° C., for a period in the region of 5 to 50 minutes, e.g. 10 minutes. The method may further include raising the temperature of the solution to a temperature in the range of 20 to 75° C. for a period of 40 to 45 minutes, e.g. 45 minutes.

The method may include subsequently adding further silver or silver nitrate, e.g. 5 to 10% further silver or silver nitrate, such as 6%. When the temperature is raised, as mentioned in the preceding paragraph, further silver may be added upon raising the temperature and the two further amounts may be added at each of 10 and 20 minutes subsequently.

The etching may be performed on the {100} or {110} plane.

The invention also provides an etched silicon substrate made by a method as described above.

The following two examples illustrate the claimed process:

EXAMPLE 1

A clean silicon sample (ca. 1 cm$^2$, 2-5 ohm cm n-type material that has been back coated as described above) is placed, face up ({100} face), in a polypropylene beaker with 50 ml of an etching solution. The composition of the etching solution was:—

12.5 ml HF (40%);
2.5 ml ethyl alcohol;
35 ml of 31.5 mM AgNO$_3$.

which corresponds to an aqueous solution containing:

5.7M of HF;
5% v/v ethyl alcohol;
22 mM of AgNO$_3$.

The sample is left at room temperature (ca. 20° C.) for 10 minutes in order to obtain uniform nucleation of silver on the sample face. As discussed below, the ethanol (or other alcohol) is essential in its modification to the HF chemistry.

The etching stage follows on from the nucleation stage. In the etching stage, the silicon substrate submerged in the above solution is placed in a constant temperature bath at e.g. 75° C. for 45 minutes; in other words the solution used in the etching stage is the same as the solution used in the nucleation stage. Depending on precise conditions and especially the duration of the method, this treatment etches the silicon and results in pillars of 20 to 100 microns in height, typically 60 to 100 microns, in height.

EXAMPLE 2

According to an alternative approach, starting with a master solution that consists of:

20 ml 0.06M AgNO$_3$ (24 mM in the final solution);
17.5 ml conc. HF (7.0M in the final solution);

2.5 ml EtOH (5% v/v in the final solution); and
10 ml H$_2$O
(50 ml total). One of the following procedures (a) to (c) is then carried out:

(a) A clean silicon sample (ca. 1 cm$^2$, 2-5 ohm cm n-type material that has been back coated as described above) is placed, face up ({100} face), in a polypropylene beaker with 50 ml of the above master solution at 20° C. for 10 minutes. Directly following on from this, the temperature is raised to 53° C. and at the same time further silver salt is added, in this case by adding 3 ml of 0.6M AgNO$_3$ solution is added. After 45 mins, the chip is removed and rinsed. The resulting pillars are ~85 microns high, which is 50% greater than obtained without the second addition of 3 ml of 0.6M AgNO$_3$ solution.

(b) A clean silicon sample (ca. 1 cm$^2$, 2-5 ohm cm n-type material that has been back coated as described above) is placed, face up ({100} face), in a polypropylene beaker with 50 ml of the above master solution at 20° C. for 10 minutes. Directly following on from this stage, the temperature is raised to 53° C. for the etching stage and at the same time 1 ml of 0.6M AgNO$_3$ solution is added. After 10 minutes a further 1 ml of 0.6M AgNO$_3$ solution is added, and after a further 10 minutes another 1 ml of 0.6M AgNO$_3$ solution is added. The total time at 53° C. is 45 minutes, resulting in uniform pillars 85 to 100 microns high and 0.2 microns in average diameter.

Such further additions of silver nitrate solution may be made during the course of the etching stage, for example, at the 15$^{th}$, 25$^{th}$ and 35$^{th}$ minute of the reaction or, for example, at the 10$^{th}$ and 20$^{th}$ minute of the reaction. In this process, the fractional coverage, F, is calculated to be 15 to 20%.

(c) A clean silicon sample (ca. 1 cm$^2$, 10 ohm cm n-type material that has been back coated as described above) is placed, face up ({100} face), in a polypropylene beaker with 50 ml of the above master solution at 20° C. for 10 minutes and then transferred to a new solution for the etching stage, which may, for example, be composed as follows:
20 ml water;
12.5 ml 60 mM Fe(NO$_3$)$_3$ (aq); and
17.5 ml 40% HF.

Uniform pillars of 40 microns in height are achieved in 45 minutes. F is measured using SEM analysis and is approximately 30%. Variation in the concentration of Fe(NO$_3$)$_3$ results in a variation in pillar diameter between about 0.2 to 0.6 microns.

Continuous or step-wise addition of Fe(NO$_3$)$_3$ and/or AgNO$_3$ solution during the etching process gives both improved uniformity and increased pillar height.

It is found that the approach of the present invention provides an increasing pillar height of approximately five times that previously obtained and significantly improved pillar uniformity over several square centimeters. As a result, silicon based electrodes can be fabricated with uniform height and packing density across wafers of 10 to 15 centimeters in diameter. Alternatively the pillars can be grown for subsequent detachment or "harvesting" for example for creating a battery anode as described in more detail in the co-pending UK patent application 0601319.7 entitled "A method of fabricating fibres composed of silicon or a silicon-based material and their use in lithium rechargeable batteries.", co-assigned herewith and incorporated herein by reference.

It has been found that the inclusion of an alcohol, for example a C$_{1-4}$ alkanol, such as ethanol, in the nucleation step provides a number of advantages.

Firstly, in terms of nucleation effects, the ethanol addition gives a more uniform silver deposition in the first, vital, period (ca. 10 seconds duration). This leads to a more uniform spatial distribution of pillars.

The effects of ethanol addition can be further understood when considering the composition effects. In particular, varying the ethanol concentration (by changing the water/alcohol ratio but maintaining the total volume at 50 ml) has an important effect on pillar height, which is believed to occur at the nucleation stage. Thus if the concentration is increased beyond 5% v/v (i.e. 2.5 ml of ethanol in the 50 mil total solution amount), the tendency is to decrease the pillar height. Further data is set out in the table below:

Effect of Ethanol (EtOH) Concentration on Pillar Height

| Vol. EtOH (ml) in 50 ml total solution volume | Nucleation Time (min)/temp° C. | Pillar growth Time (min)/temp° C. | Pillar height Microns* |
|---|---|---|---|
| 5 (10%) | 10/20 | 45/20 | 20 |
| 5 (10%) | 10/20 | 45/45 | 35 |
| 5 (10%) | 10/20 | 45/70 | 40 |
| 10 (20%) | 10/20 | 45/20 | 13 |
| 10 (20%) | 10/20 | 45/45 | 22 |
| 10 (20%) | 10/20 | 45/70 | 20 |
| 20 (40%) | 10/20 | 45/20 | 10 |
| 20 (40%) | 10/20 | 45/45 | ~0 |
| 20 (40%) | 10/20 | 45/70 | ~0 |

In terms of temperature effects, nucleation occurs very quickly, <10 seconds. The room temperature nucleated pillars are taller than those obtained at higher nucleation temperatures and thus the inventor believes there is greater control of the process when using room temperature for the nucleation stage. If for a 10 ohm cm n-type silicon wafer, the temperature is held at room temperature (20° to 25° C.) for 10 minutes for nucleation, and then raised to 50° C. for 45 minutes for the etching stage, then the pillar height will be ~30 microns. Between 70° C. and 75° C., the pillar height will be ~60 microns.

Pillars in the range of ~75 microns in height can be obtained in 45 minutes. Pillars up to 120 microns in height have also been obtained. One reason for the increased height observed by using this method is the inclusion of a small amount of AgNO$_3$ (1 ml, 60 mM added in 50 ml solution) in the Fe(NO$_3$)$_3$ etching solution.

If the etching stage is carried out at 80° C. for the same time, the pillars, although forming initially, are destroyed. However, if the etching time is reduced for an etching stage conducted at 80° C., then pillars are apparent. This last result may arises because there is some lateral etching that results in a tapered pillar structure and the ratio of the lateral to vertical etching rate increases with temperature. However, the precipitate collapse in pillar formation at 80° C. is more likely to be explained by the loss of protective adsorbates on the {110} plane.

It is found that the level of doping in the resistance in the range 0.1 ohm cm to 1,000 ohm cm has no effect. Also the process works for both n- and p-type silicon. In the 1 to 10 ohm cm range, p-type silicon has been found to etch slightly faster than n-type silicon. Furthermore, pillar growth is not limited to {100} plane. Growth of silicon structures are also observed on the {110} plane including pillars and sheets inclined at an angle of approximately 45° to the surface plane.

Etching on the {100} plane will give pillars that are at a right angle to the wafer plane. On the {110} plane, pillars at a 45° angle to the wafer plane are produced. Furthermore vertical pillars can be grown on the {111}, with protective adsorbates on the (110) faces. The etch rates are in the order {100}>{111}>>{110}.

Harvesting of silicon fibres is generally carried out using ultrasonics, because harvesting using a knife gives a large amount of particulate silicon in addition to the fibre material.

The etching process can also be carried out either on very large scale integration (VLSI) electronic grade single crystal wafers or rejected samples of the same. As a cheaper alternative, photovoltaic grade polycrystalline material may also be used. An even cheaper material that may be used is crystalline metallical grade silicon.

It will be appreciated that the pillar structure created by the methods described above can be used in any appropriate implementation including silicon anodes for use in rechargeable lithium-ion cells. Although the structures described herein are termed "pillars" it will be recognised that any appropriate pillar-like, fibre-like or hair-like structure is embraced. It will further be recognised that the parameters set out above can be varied as appropriate and that the material can extend beyond pure-silicon based material with appropriate doping to, for example, a silicon germanium mixture.

Reference herein to silicon-based material include pure silicon or doped silicon or other silicon-based material such as a silicon-germanium mixture or any other appropriate mixture. The substrate from which pillars are created may be n- or p-type, ranging from 100 to 0.001 Ohm cm, or it may be a suitable alloy of silicon, for example $Si_xGe_{1-x}$.

Other alcohols may be used in place of ethanol and other etching agents such as fluoride salt such as ammonium fluoride may be used.

Etching and nucleation are both galvanic exchange reactions, e.g.

$$Si + 6F^- + 4Ag^+ = (SiF_6)^{2-} + 4Ag$$

Other soluble silver salts may be used in the place of silver nitrate and alternative metals with soluble salts especially nitrates providing a galvanic exchange reaction may be adopted, for example a metal that is near to or less electropositive than silver. Nucleation requires metal salts, while etching can use either metal ions or non-metallic ions such as hydrogen ions or nitrate ions (or both) provided that their reduction potential is in, or near to, the range 0 to 0.8V, on the normal hydrogen scale. The articles by Peng et al mentioned above mention alternative metals that may be used in place of silver. Metal ions that have a potential between +0.8V and 0.0V (vs standard hydrogen electrode (SHE)), such as $Cu^{2+}$ ions (at +0.34V (vs SHE)) may be used instead of the silver ions).

The invention claimed is:

1. A method of etching a silicon substrate to create silicon pillars on the silicon substrate, the method comprising contacting the silicon substrate with an aqueous solution of:
   a fluoride acid or a fluoride salt,
   a silver salt capable of electroless deposition of the metal on the silicon in the presence of fluoride ions, and
   an alcohol.

2. A method as claimed in claim 1 in which the silver salt comprises silver nitrate.

3. A method as claimed in claim 2 in which the silver salt comprises a silver nitrate and wherein the silver nitrate content of the solution is in the range of 0.2 to 16% by weight.

4. A method as claimed in claim 1 in which the silver salt content of the solution is in the range of 5 to 100 mM.

5. A method as claimed in claim 1 in which the fluoride acid comprises hydrogen fluoride whose content is between 3 and 20% by weight.

6. A method as claimed in claim 1 in which the etching fluoride acid comprises hydrogen fluoride whose content is between 1.5 and 10M.

7. A method as claimed in claim 1 in which the alcohol comprises ethanol.

8. A method as claimed in claim 1 in which the alcohol content is in the range of up to 40% by volume.

9. A method as claimed in claim 1 further comprising the stage of allowing the substrate to stand in solution at a temperature in the range 0° C. to -30° C.

10. A method as claimed in claim 9, wherein said standing step lasts for a period in the region of 5 to 50 minutes.

11. A method as claimed in claim 1 further comprising raising the temperature of the solution to a temperature in the range 40° C. to 75° C.

12. A method as claimed in claim 11, wherein the substrate is allowed to stand in the solution at the raised temperature for a period in the region of 30 to 100 minutes.

13. A method as claimed in claim 1 further comprising adding additional silver salt or a ferric salt or another species giving rise to nitrate ions during the course of the method.

14. A method as claimed in claim 13 wherein the amount of the additional silver salt or ferric salt or another species giving rise to nitrate ions added is in the range of 0.1 to 2% by weight.

15. A method as claimed in claim 13 wherein the additional silver salt or ferric salt or other species giving rise to nitrate ions is added in an amount that increases the silver or ferric or other species giving rise to nitrate ions concentration of the solution by 2 mM to 6 mM.

16. A method as claimed in claim 13 including raising the temperature of the solution and, in which the additional silver salt or the ferric salt or other species giving rise to nitrate ions is added upon raising the temperature.

17. A method as claimed in claim 16 in which a first additional amount of a silver salt or ferric salt or other species giving rise to nitrate ions is added upon raising the temperature and then at least one further additional amount of a silver salt or ferric salt or other species giving rise to nitrate ions is added subsequently.

18. A method of etching a silicon substrate as claimed in claim 1 wherein the said contacting step forms a first stage using a first solution and the method further comprises:
    a second stage comprising contacting the silicon substrate with a second solution comprising a fluoride acid and a ferric salt or another species giving rise to nitrate ions.

19. A method as claimed in claim 18, wherein the substrate is allowed to stand in the first solution for a period in the region of up 15 minutes.

20. A method as claimed in claim 18 wherein the second stage is conducted at a temperature above that of the first stage.

21. A method as claimed in claim 18 wherein the second stage is conducted for a period in the region of 40 to 50 minutes.

22. A method as claimed in claim 18 wherein the second solution includes a silver salt.

23. A method as claimed in claim 18, further comprising adding a silver salt or additional ferric salt or other species giving rise to nitrate ions to the second solution during the second stage.

24. A method as claimed in claim 23, wherein the amount of further silver or additional ferric salt or other species giving rise to nitrate ions that is added in an amount that increases the silver or ferric concentration of the solution by up to 10 mM.

25. A method as claimed in claim 23 in which the silver salt or additional ferric salt or other species giving rise to nitrate ions is added to the second solution in two or more occasions.

26. A method as claimed in claim 18 wherein the substrate is allowed to stand in the second solution for a period in the region of 40 to 50 minutes.

27. A method as claimed in claim 1 in which etching is performed on the {100} plane or the {110} plane or the {111} plane.

28. A method as claimed in claim 1 in which the etching is performed electrolessly.

29. A method of etching a silicon substrate to create silicon pillars on the silicon substrate, the method comprising contacting the silicon substrate with an aqueous solution of:
   a fluoride acid or a fluoride salt,
   metal salt capable of electroless deposition of the metal on the silicon in the presence of fluoride ions, and
   an alcohol, wherein the metal salt content of the solution is in the range of 5 to 100 mM.

30. A method as claimed in claim 29 in which the etching fluoride acid comprises hydrogen fluoride whose content is between 1.5 and 10M.

31. A method as claimed in claim 29 in which the alcohol comprises ethanol.

32. A method as claimed in claim 29 in which the alcohol content is in the range of up to 40% by volume.

33. A method as claimed in claim 29 further comprising the stage of allowing the substrate to stand in solution at a temperature in the range 0° C. to 30° C.

34. A method as claimed in claim 29 in which the metal salt comprises a silver salt.

35. A method as claimed in claim 29 in which the etching is performed electrolessly.

* * * * *

UNITED STATES PATENT AND TRADEMARK OFFICE
CERTIFICATE OF CORRECTION

PATENT NO. : 8,585,918 B2  
APPLICATION NO. : 12/161657  
DATED : November 19, 2013  
INVENTOR(S) : Green et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1367 days.

Signed and Sealed this
Twenty-second Day of September, 2015

Michelle K. Lee
*Director of the United States Patent and Trademark Office*